(12) United States Patent
Lotito et al.

(10) Patent No.: US 10,347,799 B2
(45) Date of Patent: Jul. 9, 2019

(54) STABILIZED QUANTUM DOT COMPOSITE AND METHOD OF MAKING A STABILIZED QUANTUM DOT COMPOSITE

(71) Applicant: Cree, Inc., Durham, NC (US)

(72) Inventors: Kenneth Lotito, Santa Barbara, CA (US); Ryan Gresback, Santa Barbara, CA (US); Ceri Griffiths, Carpinteria, CA (US); Paul Fini, Santa Barbara, CA (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 15/809,241

(22) Filed: Nov. 10, 2017

(65) Prior Publication Data
US 2019/0148603 A1 May 16, 2019

(51) Int. Cl.
| | |
|---|---|
| *F21K 9/20* | (2016.01) |
| *F21K 9/64* | (2016.01) |
| *C09K 11/02* | (2006.01) |
| *H01L 33/50* | (2010.01) |
| *B82Y 40/00* | (2011.01) |
| *B82Y 20/00* | (2011.01) |

(52) U.S. Cl.
CPC .......... *H01L 33/502* (2013.01); *C09K 11/025* (2013.01); *F21K 9/20* (2016.08); *F21K 9/64* (2016.08); *B82Y 20/00* (2013.01); *B82Y 40/00* (2013.01); *Y10S 977/774* (2013.01); *Y10S 977/892* (2013.01); *Y10S 977/90* (2013.01); *Y10S 977/95* (2013.01)

(58) Field of Classification Search
None
See application file for complete search history.

(56) References Cited

U.S. PATENT DOCUMENTS

| | | |
|---|---|---|
| 6,350,041 B1 | 2/2002 | Tarsa et al. |
| 7,614,759 B2 | 11/2009 | Negley |
| 7,867,557 B2 | 1/2011 | Pickett et al. |

(Continued)

FOREIGN PATENT DOCUMENTS

| | | |
|---|---|---|
| GB | 2472541 A | 9/2011 |
| WO | WO 2013/175317 A1 | 11/2013 |

(Continued)

OTHER PUBLICATIONS

Aubert, Tangi et al., "Bright and Stable CdSe/CdS@SiO$_2$ Nanoparticles Suitable for Long-Term Cell Labeling", *ACS Applied Materials & Interfaces*, 6, 14 (2014), pp. 11714-11723.

(Continued)

*Primary Examiner* — Ashok Patel
(74) *Attorney, Agent, or Firm* — Brinks Gilson & Lione

(57) ABSTRACT

A stabilized quantum dot composite includes a plurality of luminescent semiconducting nanoparticles embedded in a matrix comprising an ionic metal oxide. A method of making a stabilized quantum dot composite includes forming a mixture comprising a plurality of luminescent semiconducting nanoparticles dispersed in an aqueous solution comprising an ionic metal oxide. The mixture is dried to form a stabilized quantum dot composite comprising the plurality of luminescent semiconducting nanoparticles embedded in a matrix comprising the ionic metal oxide.

15 Claims, 8 Drawing Sheets

(56) References Cited

U.S. PATENT DOCUMENTS

| | | |
|---|---|---|
| 8,425,071 B2 | 4/2013 | Ruud et al. |
| 8,563,339 B2 | 10/2013 | Tarsa et al. |
| 8,591,062 B2 | 11/2013 | Hussell et al. |
| 8,596,819 B2 | 12/2013 | Negley et al. |
| 8,622,584 B2 | 1/2014 | Kinnune et al. |
| 8,624,271 B2 | 1/2014 | Reiherzer et al. |
| 8,777,449 B2 | 7/2014 | Van De Ven et al. |
| 8,859,442 B2 | 10/2014 | Naasani et al. |
| 8,957,401 B2 | 2/2015 | Pickett et al. |
| 9,028,087 B2 | 5/2015 | Wilcox et al. |
| 9,048,396 B2 | 6/2015 | Lowes et al. |
| 9,070,850 B2 | 6/2015 | Keller et al. |
| 2008/0160306 A1* | 7/2008 | Mushtaq ............... C01B 25/082 428/402 |
| 2008/0173884 A1 | 7/2008 | Chitnis et al. |
| 2008/0179611 A1 | 7/2008 | Chitnis et al. |
| 2009/0267051 A1 | 10/2009 | Kim et al. |
| 2012/0051041 A1 | 3/2012 | Edmond et al. |
| 2012/0280261 A1 | 11/2012 | Tarsa et al. |
| 2012/0327650 A1 | 12/2012 | Lay et al. |
| 2013/0026371 A1* | 1/2013 | Holloway ................. G01T 1/16 250/362 |
| 2013/0313595 A1* | 11/2013 | Naasani ............... C09K 11/623 257/98 |
| 2013/0341590 A1 | 12/2013 | Gupta et al. |
| 2014/0347885 A1 | 11/2014 | Wilcox et al. |
| 2014/0355302 A1 | 12/2014 | Wilcox et al. |
| 2015/0024543 A1 | 1/2015 | Harris et al. |
| 2015/0053914 A1 | 2/2015 | Kurtin et al. |
| 2015/0108524 A1 | 4/2015 | Pickett et al. |
| 2015/0253488 A1 | 9/2015 | Wilcox et al. |
| 2015/0362168 A1 | 12/2015 | Power et al. |
| 2016/0336490 A1 | 11/2016 | Zhao et al. |

FOREIGN PATENT DOCUMENTS

| | | |
|---|---|---|
| WO | WO 2014/070423 A1 | 5/2014 |
| WO | WO 2014/093391 A2 | 6/2014 |
| WO | WO 2014/140866 A2 | 9/2014 |
| WO | WO 2015/026464 A1 | 2/2015 |
| WO | WO 2015/036762 A1 | 3/2015 |

OTHER PUBLICATIONS

Aubert, Tangi et al., "Bright and Stable CdSe/CdS@SiO$_2$ Nanoparticles Suitable for Long-Term Cell Labeling", 6$^{th}$ Conference on Nanoscience with Nanocrystals (2014),1 page (Poster presentation).

Chen, Ou et al., "Compact high-quality CdSe—CdS core-shell nanocrystals with narrow emission linewidths and suppressed blinking", *Nature Materials*, 12, 5 (Feb. 3, 2013) pp. 445-451.

\* cited by examiner

STABILIZED QUANTUM DOT COMPOSITE AND METHOD OF MAKING A STABILIZED QUANTUM DOT COMPOSITE

TECHNICAL FIELD

The present disclosure is related generally to light emitting diodes (LEDs) and more specifically to stabilized quantum dot composites that have applications in LED components, displays and lighting products.

BACKGROUND

For LED lighting applications, down-converting nanoparticles such as cadmium selenide quantum dots, indium phosphide quantum dots, and lead-halide perovskite quantum dots may offer several significant technological advantages over conventional inorganic phosphors. Of primary interest are their narrow photoluminescence emission line widths, which may be below 40 nm FWHM (full width at half maximum), along with their tunable photoluminescence peak position. Both properties are typically unavailable in conventional down-converting phosphors, such as cerium (III)-doped yttrium aluminum garnet (YAG:$Ce^{3+}$), used for LED lighting and display applications.

A major obstacle to the commercial deployment of down-converting nanoparticles in lighting products, however, is their stability. Products for general lighting are routinely offered with operational lifetimes greater than 25,000, 50,000, and even 100,000 hours of use. Accordingly, the demands for material stability and product reliability are exceedingly high. To date, quantum dots of the types identified above have generally lacked the stability required to be commercially viable under typical LED package operating conditions.

A common cause of the instability of luminescent nanoparticles is their sensitivity to atmospheric oxygen and moisture. Under the harsh operating conditions of a LED, quantum dots may react with atmospheric oxygen and moisture, which may lead to an unacceptable loss in luminous flux output or change in color point.

BRIEF SUMMARY

A stabilized quantum dot composite and a simple and cost-effective method of making a stabilized quantum dot composite are set forth herein.

The stabilized quantum dot composite comprises a plurality of luminescent semiconducting nanoparticles embedded in a matrix comprising an ionic metal oxide.

The method comprises forming a mixture including a plurality of luminescent semiconducting nanoparticles dispersed in an aqueous solution comprising an ionic metal oxide. The mixture is dried to form a stabilized quantum dot composite comprising the plurality of luminescent semiconducting nanoparticles embedded in a matrix comprising the ionic metal oxide.

DETAILED DESCRIPTION

Definitions

Figure 1A:
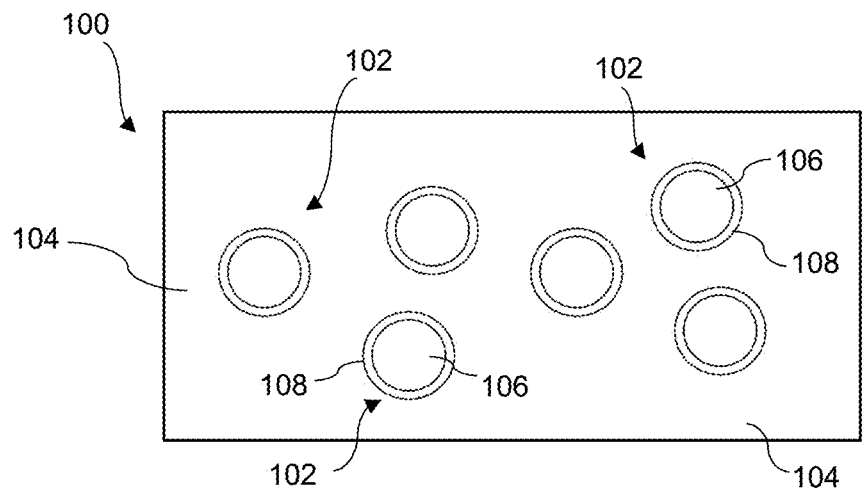
FIG. 1A is a schematic of an exemplary stabilized quantum dot composite comprising luminescent semiconducting nanoparticles embedded in a matrix comprising an ionic metal oxide.

A first device that is described as being "in optical communication with" a second device may be understood to be positioned such that light from the first device reaches the second device, or vice versa.

"Dominant wavelength" refers to the wavelength of light that has the same apparent color as the light emitted from an LED, as perceived by the human eye. The dominant wavelength differs from peak wavelength in that the dominant wavelength takes into account the sensitivity of the human eye to different wavelengths of light.

A luminescent semiconducting nanoparticle or quantum dot comprising multiple layers (e.g., a core-shell structure) may be described using slash mark notation (e.g., "x/y/z"), where x may be understood to be a core or a layer underlying y, which may be understood to be a layer underlying z. Stated differently, z may be understood to be a layer that partially or fully overlies or surrounds y, which may be understood to be a layer that partially or fully overlies or surrounds x.

It is understood that when an element such as a layer, region, or substrate is referred to as being "on" another element, it can be directly on the other element or intervening elements may also be present. Furthermore, relative terms such as "inner," "outer," "upper," "above," "over," "overlying," "beneath," "below," "top," "bottom," and similar terms, may be used herein to describe a relationship between elements. It is understood that these terms are intended to encompass orientations of the device that differ from those depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

The figures are intended as schematic illustrations. As such, the actual dimensions and shapes of the devices and components (e.g., layer thicknesses) can be different, and departures from the illustrations as a result of, for example, manufacturing techniques and/or tolerances may be expected. Embodiments should not be construed as limited to the particular shapes of the regions illustrated herein but are to include deviations in shapes that result from, for example, manufacturing. A region illustrated or described as square or rectangular may have rounded or curved features due to normal manufacturing tolerances. Thus, the regions illustrated in the figures are schematic in nature and their shapes are not intended to illustrate the precise shape of a region of a device and are not intended to limit the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. The terms "elements" and "a plurality of elements" may be understood to refer to "more than one element," where "element" may be replaced with any noun. It may be further understood that the terms "comprises" "comprising," "includes" and/or "including" specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

This disclosure describes the use of an ionic metal oxide encapsulant or matrix as a simple, low-cost, and effective means to enhance the stability of quantum dots and the reliability of lighting devices into which they are incorporated. For example, when pre-formulated, aqueous potassium silicate ($nK_2O.mSiO_2$) solutions are mixed with compatible luminescent semiconducting nanoparticles and dried, the resulting dense composite may exhibit greatly enhanced stability compared to the un-encapsulated material. Data suggest that the ionic metal oxide matrix functions as an effective oxygen and moisture barrier that prevents oxygen and moisture damage to the luminescent semiconducting particles during device operation.

FIG. 1A shows a schematic of a stabilized quantum dot composite 100 including a plurality of luminescent semiconducting nanoparticles 102 embedded in a matrix 104 comprising an ionic metal oxide. Each of the luminescent semiconducting nanoparticles, which may alternatively be referred to as "luminescent nanoparticles" or "semiconducting nanoparticles," comprises a semiconductor. As shown schematically in FIG. 1A, each of the luminescent semiconducting nanoparticles 102 has an interior 106 comprising the semiconductor with an optional buffer layer 108 partially or fully surrounding the interior 106. The semiconducting nanoparticles 102 typically have a linear size (e.g., width or diameter) of about 100 nm or less. Due to the impact of particle size on light emission, as discussed below, the linear size may also be less than about 50 nm, or less than about 20 nm.

The ionic metal oxide may comprise a chemical formula $nA_xO_y \cdot mB_zO_w$, where A is a member of the alkali or alkali earth metals, B is a group 13 or group 14 metal or metalloid, x, y, z, and w are positive integers, and n and m are stoichiometry coefficients indicating that the net composition can contain varying amounts of $A_xO_y$ and $B_zO_w$. In one example, x=2, y=1, z=1, and w=2, and the chemical formula of the ionic metal oxide is $nA_2O \cdot mBO_2$. A molar ratio n:m may range from about 1:1 to about 1:5. Preferably, A includes one or more elements selected from the group consisting of Li, Na, K, Rb, Cs, Be, Mg, Ca, Sr, and Ba, and B includes one or more elements selected from the group consisting of B, Al, Ga, In, Si, Ge, Sn, and Pb. For example, B may comprise Si, and the ionic metal oxide may comprise a silicate, such as sodium silicate or potassium silicate. In some embodiments, the silicate may be modified to include an additional oxide, such as magnesium oxide or lead oxide. In the experimental examples in this disclosure, A comprises K, and the ionic metal oxide comprises potassium silicate, where the chemical formula of the ionic metal oxide can be represented as $nK_2O \cdot mSiO_2$. The molar ratio n:m may lie in a range from about 1:1.5 to about 1:4.5 for potassium silicate as well as for other ionic metal oxides.

The semiconductor may be a group IV semiconductor, a group II-VI semiconductor, a group III-V semiconductor, a group I-III-VI$_2$ semiconductor, or a perovskite semiconductor. Specific examples include: group IV semiconductors such as Si and Ge; group II-VI semiconductors such as CdS, CdSe, ZnS, ZnSe, CdTe, and PbS; group III-V semiconductors such as $Al_xGa_yIn_{1-x-y}P$ and $Al_xIn_yGa_{1-x}N$, where $0 \leq x \leq 1$ and $0 \leq y \leq 1$; perovskite semiconductors such as $CsPbX_3$, where X=Cl, Br and/or I; and group I-III-VI$_2$ semiconductors such as CuInGaS. The interior 106 of the luminescent particle 102 may include more than one semiconductor, such as first and second semiconductors in a core-shell structure, as discussed in greater detail below. In an embodiment in which the semiconductor comprises a perovskite semiconductor, the luminescent semiconducting nanoparticles may be encapsulated in an oxide coating as set forth in U.S. patent application Ser. No. 15/809,213, entitled "Stabilized Luminescent Nanoparticles Comprising a Perovskite Semiconductor and Method of Fabrication," which was filed on Nov. 10, 2017, and is hereby incorporated by reference.

The buffer layer 108, when present, may comprise an oxide coating that can provide compatibility between the semiconductor and the ionic metal oxide during synthesis. The buffer layer 108 may also help to prevent or minimize (in combination with the matrix 104) environmental degradation of the luminescent nanoparticles during use in a light emitting device. The oxide coating may comprise an oxide such as silicon oxide ($SiO_x$, where $0.5 \leq x \leq 2.5$, e.g., $SiO_2$), aluminum oxide, zinc oxide, indium tin oxide, titanium oxide, or vanadium oxide.

The stabilized quantum dot composite 100 shown schematically in FIG. 1A has the form of a rectangular prism (assuming a third dimension going into the page); however, the matrix 104 and thus the composite 100 can have any desired morphology that can be fabricated. For example, the composite 100 and matrix 104 may take the form of a microparticle, a coating, or a macroscopic body. The microparticle or macroscopic body may have a spherical, polygonal, elongated, irregular, or another arbitrary or predetermined shape. The macroscopic body may in some cases take the form of a molded body or a 3D printed object, as discussed further below. The microparticle may have linear dimensions (e.g., length and/or width) in a range from about 1 micron to about 500 microns, whereas the macroscopic body may be greater than 500 microns in linear size and as large as several millimeters or even several centimeters. The coating may have a thickness ranging from the nanoscale to the milliscale (typically between about 100 nm and 1 mm) and may cover an area ranging from about 1 $\mu m^2$ to hundreds of $mm^2$. Given the nanoscale size of the luminescent nanoparticles 102, a large plurality (e.g., thousands, millions, billions) of the nanoparticles 102 may be dispersed in the matrix 104, whether the composite 100 takes the form of a microparticle, macroscopic body, coating, molded body, and/or 3D printed object.

Figure 1B:
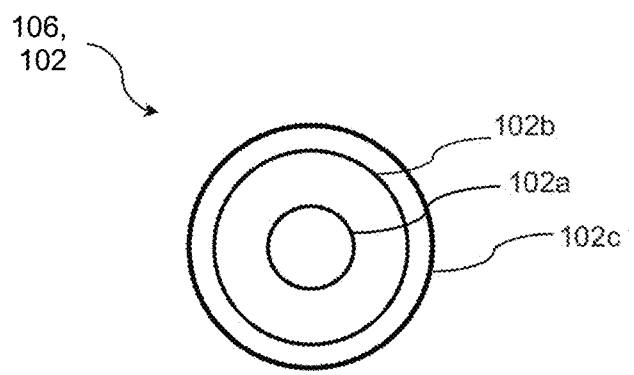
FIG. 1B is a schematic of the interior of one of the luminescent semiconducting nanoparticles of FIG. 1A revealing a possible core-shell structure.

Referring now to FIG. 1B, the interior 106 of the luminescent nanoparticle 102 may comprise a core-shell structure including a semiconducting core 102a comprising a first semiconductor and a first semiconducting shell 102b overlying the core 102a that comprises a second semiconductor. The semiconducting core 102a may function as a light emission center and the first semiconducting shell 102b may function as an absorption enhancer. In one example, the first semiconductor may comprise a group II-VI semiconductor such as CdSe and the second semiconductor may comprise CdS. The luminescent semiconducting nanoparticle may further comprise a second semiconducting shell 102c overlying the first semiconducting shell 102b and comprising a third semiconductor. The second semiconducting shell 102c may serve as a high-quality, essentially defect-free separation layer and may comprise, in one example, ZnS. Each of the first, second and/or third semiconductors may be different from each other and may be single-crystalline or polycrystalline.

Constraining the particle (or crystallite) size of a semiconducting material to a few to tens of nanometers (i.e., close to or less than the exciton Bohr radius) is called quantum confinement; electronic carriers within these so-called quantum dots are spatially restricted. Discrete energy levels may appear, in contrast to the continuous bands of allowed energies in bulk semiconductors, and the bandgap energy is increased. The smaller the particle size—and thus the more severe the carrier confinement—the greater the increase. Thus, the emission wavelength may be controlled by varying the size of the quantum dot (i.e., the luminescent semiconducting nanoparticle), where larger particle sizes are associated with a red-shift of the emission. For light emitting diode applications, it is advantageous that the semiconducting nanoparticle absorbs blue light and down-converts the blue light to a longer emission wavelength (e.g., green, yellow or red). As indicated above, the first shell 102b may function as an absorption enhancer and thus may be engineered for the absorbance of blue light, while the semiconducting core 102a may function as the light emission center and may be optimized for down conversion to a particular wavelength (e.g., 615 nm). Typically, the semiconducting core 102a may have a size of from about 1.5 nm to about 5 nm, and the first semiconducting shell 102b may have a thickness of from about 0.5 nm to about 20 nm. When present, the second semiconducting shell 102c may have a thickness of from about 0.5 nm to about 20 nm.

Alternatively, the luminescent semiconducting nanoparticle 102 may not have a core-shell structure and may instead comprise a (single) semiconductor or a phosphor. The semiconductor or phosphor may be a down-converter of blue or UV wavelengths of light, and may further be single-crystalline or polycrystalline.

A simple and inexpensive method has been developed to synthesize the stabilized quantum dot composite shown schematically in FIG. 1A. The method may entail forming a mixture including a plurality of luminescent semiconducting nanoparticles dispersed in an aqueous solution, where the luminescent semiconducting nanoparticles comprise a semiconductor and the aqueous solution comprises an ionic metal oxide. After obtaining a preferably uniform dispersion of the semiconducting nanoparticles in the aqueous solution, the mixture is dried and a stabilized quantum dot composite is formed. The stabilized quantum dot composite includes the luminescent semiconducting nanoparticles embedded in a matrix comprising the ionic metal oxide. Advantageously, the stabilized quantum dot composite may be optically transparent, a characteristic that may be aided by obtaining a uniform dispersion of the semiconducting nanoparticles in the aqueous solution during synthesis and in the matrix upon drying.

A centrifugal mixer or another commercially available mixing apparatus may be employed to obtain a uniform dispersion of the luminescent semiconducting nanoparticles in the aqueous solution. Drying of the mixture may entail removing water from the aqueous solution (e.g., by evaporation) at ambient temperature or at an elevated temperature (e.g., up to 500° C.) over a predetermined amount of time (e.g., up to 72 h). The mixing and drying steps may be carried out in air or in a controlled environment, such as an inert gas environment or a vacuum. The morphology of the stabilized quantum dot composite formed from the method (e.g., macroscopic body, microparticles, coating) may be determined by the specifics of the fabrication process. FIGS. 2A-2E provide flow charts of the fabrication of stabilized quantum dot composites having various morphologies.

Figure 2A:
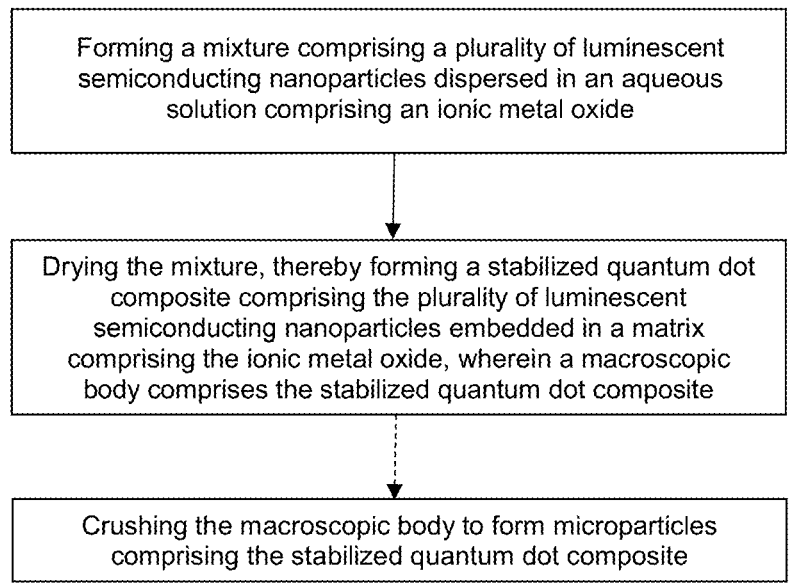
FIGS. 2A-2E are flow charts of the fabrication of stabilized quantum dot composites having various morphologies (e.g., microparticle, macroscopic body, or coating).
Figure 2B:
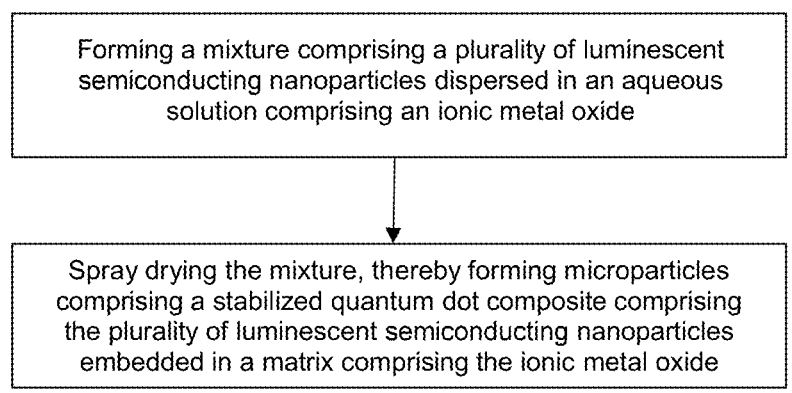

Referring to FIG. 2A, after carrying out the mixing and drying described above, a macroscopic body comprising the stabilized quantum dot composite may be formed. For some applications, the macroscopic body may then be crushed by mechanical milling or another grinding process to form microparticles comprising the stabilized quantum dot composite. The microparticles may alternatively be formed directly during drying—without going through the intermediate step of forming the macroscopic body—by a spray drying process known in the art, as indicated in the flow chart of FIG. 2B. In this case, the mixture may be forced through a spray nozzle or atomizer while being exposed to a heated gas to promote rapid drying of the mixture into microparticles comprising the stabilized quantum dot composite.

The microparticles formed by crushing or spray drying may have a shape ranging from irregular to spherical with a nominal particle size (or linear size) in a range from about 1 micron to about 500 microns, where each microparticle may include thousands or millions (or more) of the luminescent semiconducting nanoparticles, as discussed above. The microparticles may be mixed with a polymeric encapsulant such as silicone for use in a LED component. Thus, the microparticles comprising the stabilized quantum dot composite may be used in place of or in combination with conventional inorganic phosphors. Due to their microscale size, the microparticles can be handled and processed with the same ease as conventional inorganic phosphors, while providing the optoelectronic benefits of quantum dots.

Figure 2C:
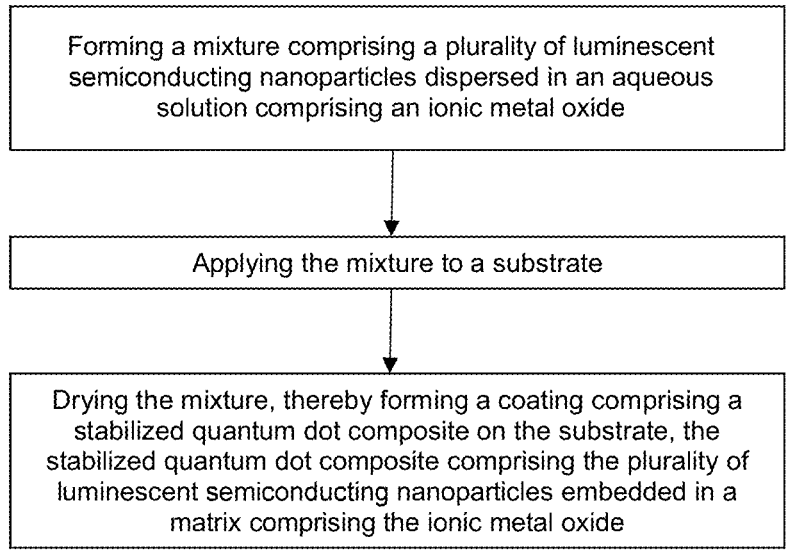
Figure 2D:
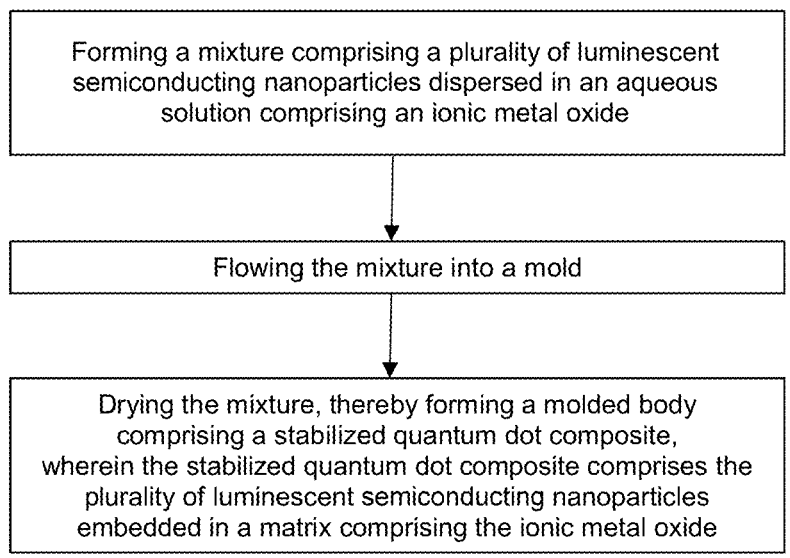

In another example, as indicated in FIG. 2C, the mixture comprising the luminescent semiconducting nanoparticles and the aqueous solution may be applied to a substrate, such as an acrylic waveguide, glass plate, or another planar or curved substrate. The mixture can be applied by any of a number of deposition methods known in the art, such as dip coating, spin coating, or spray coating. Upon drying, a coating comprising the stabilized quantum dot composite may be formed on the substrate for use, for example, in a remote location for a display, signage, or another lighting product. The high optical density of the luminescent semiconducting nanoparticles in the composite and the ability to solution process the mixture may enable the fabrication of small, light-emitting coated surfaces with highly saturated colors.

It is also contemplated that the mixture may be modified to obtain a coefficient of thermal expansion (CTE) match between the stabilized quantum dot composite and the substrate, or more specifically between the matrix and the substrate. The modification may entail compositional modification such as doping or alloying, for example. CTE matching may help to reduce cracking that can occur upon drying and/or during thermal cycling of the coating or macroscopic body comprising the stabilized quantum dot composite.

Figure 2E:
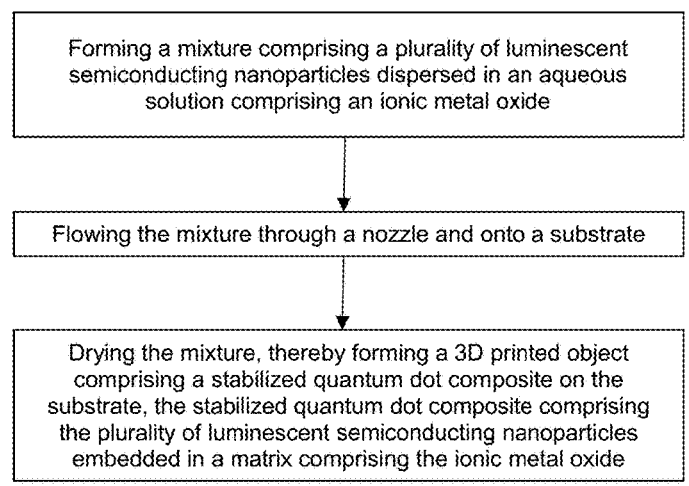

The macroscopic body obtained upon drying may be supported on or bonded to a substrate, and/or formed in a mold to obtain a predetermined morphology of the stabilized quantum dot composite. For example, as indicated in the flow chart of FIG. 2D, the mixture comprising the luminescent nanoparticles and the aqueous solution may be poured into a mold prior to drying. A molded body such as an optical lens comprising the stabilized quantum dot composite may be formed in this way. Alternatively, the mixture may be 3D printed to obtain a predetermined shape of the macroscopic body on a substrate. In this case, the method may include flowing the mixture through a nozzle and onto a substrate in a layer-by-layer fashion, as indicated in FIG. 2E. The substrate may be heated (e.g., up to 100° C.) during deposition. Upon drying, a 3D printed object (e.g., an optical lens) comprising the stabilized quantum dot composite may be formed.

The substrate of any of these examples may comprise a ceramic, a polymer, and/or a semiconductor such as glass, sapphire, acrylic, or gallium nitride.

Figures 3A, 3B:
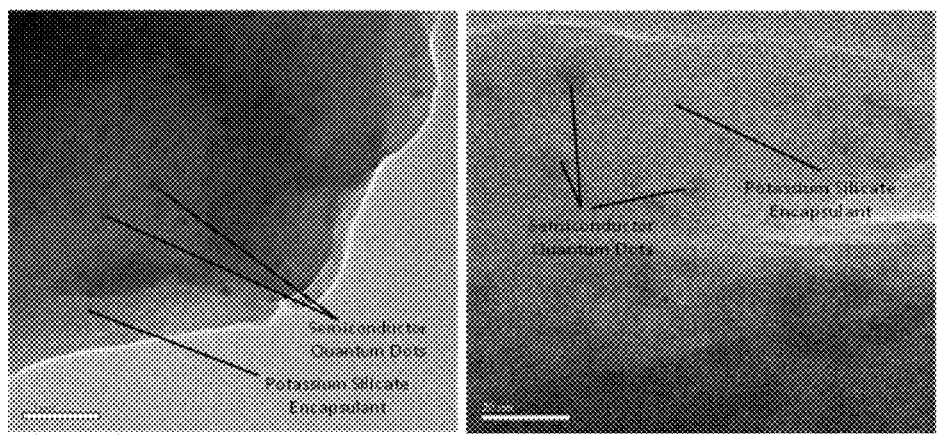
FIGS. 3A and 3B are transmission electron microscopy (TEM) images of luminescent semiconducting nanoparticles comprising CdSe/CdS/$SiO_x$ in a matrix comprising potassium silicate.

An exemplary stabilized quantum dot composite including a plurality of luminescent semiconducting nanoparticles embedded in a matrix comprising an ionic metal oxide is shown in the transmission electron microscope (TEM) images of FIGS. 3A and 3B. In these examples, the matrix comprises potassium silicate, and the luminescent semiconducting nanoparticles have an interior comprising a CdSe/CdS core-shell structure, with a buffer layer comprising $SiO_x$ overlying the interior. The stabilized quantum dot composite takes the form of microparticles produced by mechanical grinding. To form the composite of this example, 50 mg of $CdSe/CdS/SiO_x$ quantum dots are added to a small plastic cup and combined with 500 mg of KASIL18, a commercially available, pre-formulated potassium silicate solution. (The preparation of the $CdSe/CdS/SiO_x$ quantum dots is described in U.S. Pat. No. 9,780,266, entitled "Stabilized Quantum Dot Structure and Method of Making a Stabilized Quantum Dot Structure," which is hereby incorporated by reference.) The mixture is placed in a centrifugal mixer and mixed until a uniform, transparent dispersion is obtained. The mixture is poured into an open cylindrical mold of approximately 2 cm in diameter and 5 mm in depth. Prior to adding the quantum dot-silicate mixture, the mold is lined with a thermally resistant adhesive tape (e.g., Kapton) to allow for release of the dried material from the mold. The sample is then placed in an oven at 100° C. and dried overnight in air for approximately 16 h, yielding a brittle, opaque disk. The disk is placed in a ball-mill and ground to a micron-sized powder. The microparticles formed from mechanical milling can then be added to a suitable optical encapsulant and used with LED components.

To test the reliability of light emitting devices including the stabilized quantum dot composite described above, the microparticles and optical-grade polymeric encapsulant are applied to a LED as a slurry in a process analogous to that used for conventional down-converting phosphors.

The stability of the stabilized quantum dot composite is determined by monitoring the change in the wavelength of the emission from the luminescent semiconducting nanoparticles over time. As the semiconducting nanoparticles are damaged by oxygen or moisture, the emission peak position shifts towards shorter wavelengths. Therefore, the change in the emission wavelength over time can be an accurate and sensitive measure of the stability of the luminescent semiconducting nanoparticles, where smaller shifts indicate higher stability.

Figure 4A:
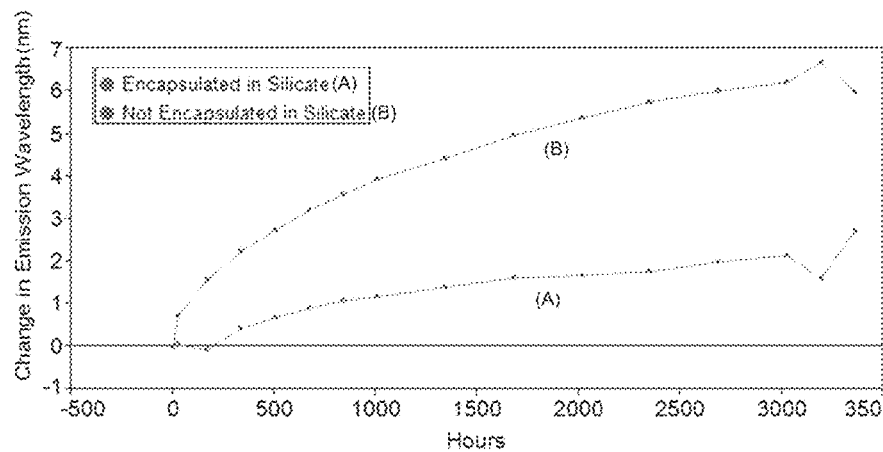
FIG. 4A shows the magnitude of the emission wavelength shift (units of nm) over time during LED operation for a stabilized quantum dot composite (bottom data set) in comparison with semiconducting nanoparticles not dispersed in a silicate matrix (top data set).

In one example, after 3360 h of LED operation at 85° C., the emission peak of a quantum dot composite comprising $CdSe/CdS/SiO_x$ semiconducting nanoparticles in a potassium silicate matrix shifted by only about 2 nm, as shown in FIG. 4A. In contrast, without the potassium silicate matrix, the emission peak of the $CdSe/CdS/SiO_x$ semiconducting nanoparticles shifted by about 6 nm under the same conditions for the same time duration. Accordingly, the data show that micro- or macro-scale encapsulation of the semiconducting nanoparticles in a silicate matrix may enhance the stability of the quantum dots by at least about a factor of 3.

Figure 4B:
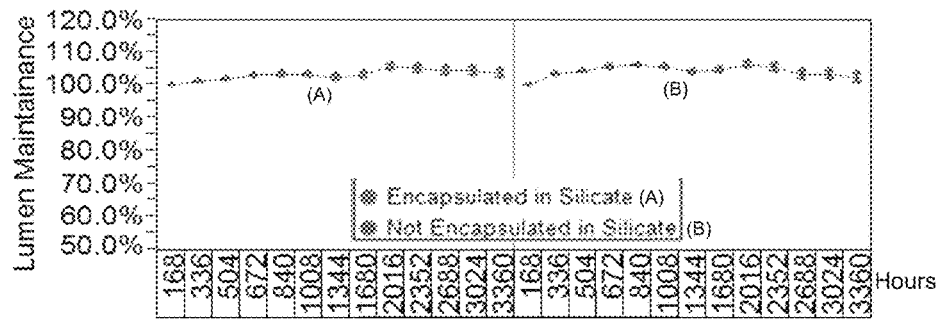
FIG. 4B shows lumen maintenance of LEDs prepared with (left data set) and without (right data set) silicate encapsulation of the semiconducting nanoparticles.

LEDs including the stabilized quantum dot composite (in this example, $CdSe/CdS/SiO_x$ semiconducting particles in a potassium silicate matrix) for down conversion show stable luminous flux output over 3360 h of operation, as shown by the data of FIG. 4B. There is a negligible enhancement in the luminous flux output compared to the same semiconducting nanoparticles not encapsulated in the silicate matrix.

Figure 5:
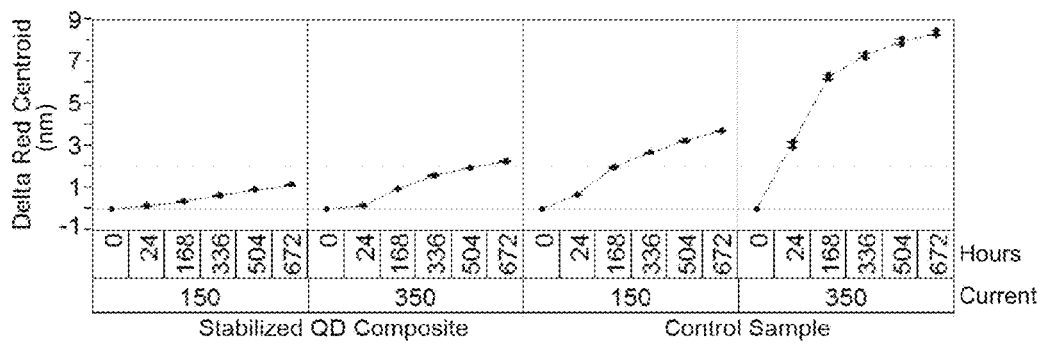
FIG. 5 shows color stability (units of nm) of a LED including a stabilized quantum dot composite in comparison with semiconducting nanoparticles not encapsulated with silicate under high temperature operating life (HTOL) conditions at 150 mA and 350 mA.

Additional data demonstrating enhanced color stability for the above-described stabilized quantum dot composite during high-temperature operating life (HTOL) conditions are shown in the plots of FIG. 5. It can be observed that at a LED drive current of 150 mA, the color stability over 672 hours is improved by about three times for the stabilized quantum dot composite compared to luminescent semiconducting particles that are not encapsulated in a silicate matrix ("control sample"). At 150 mA, there is a modest trade off (about 5%) in quantum yield (QY) with similar QY stability over 672 hours (not shown). At 350 mA, the color stability improvement for the stabilized quantum dot composite increases to about four times over 672 hours, as can be seen in FIG. 5, and the QY performance is similar between the silicate-encapsulated and non-silicate-encapsulated semiconducting particles (not shown). Since potassium silicate is hygroscopic, similar color and QY stability may not be observed for the quantum dot composite during a wet high temperature operating life (WHTOL) test.

Figure 6:
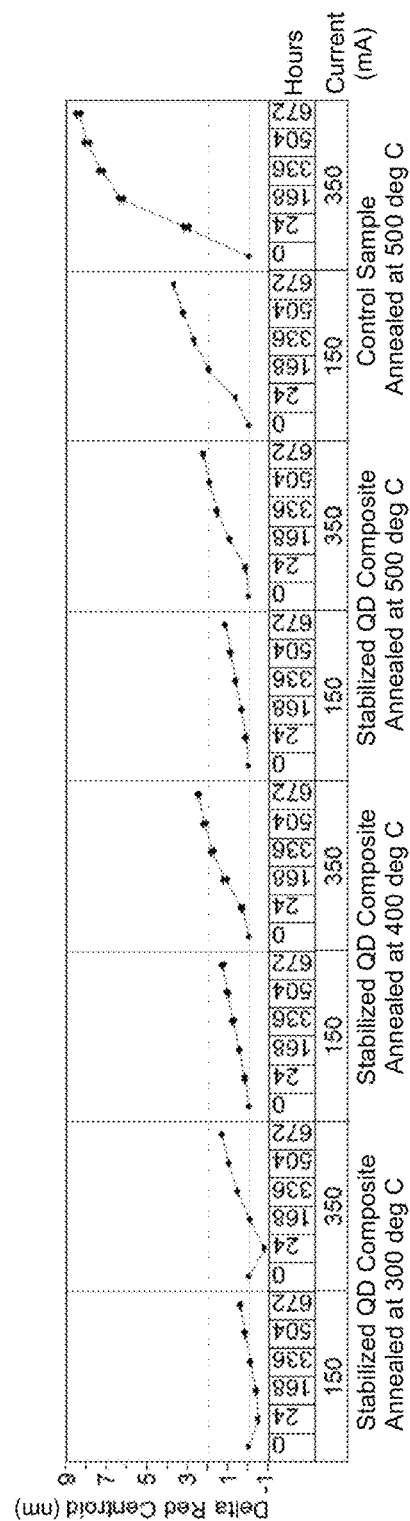
FIG. 6 shows the color stability (units of nm) of three stabilized quantum dot composites that include semiconducting nanoparticles annealed at 300° C., 400° C., and 500° C., respectively, compared to a control sample comprising 500° C.-annealed-semiconducting nanoparticles without silicate encapsulation.

Data from low temperature annealing experiments conducted at 300° C., 400° C., and 500° C. reveal that the stabilized quantum dot composite shows similar color stability at each annealing temperature, as can be seen in FIG. 6. In each case, the color stability is significantly better than that obtained from the control sample (non-silicate-encapsulated semiconducting nanoparticles). The annealing experiments entailed heating the luminescent semiconducting nanoparticles after synthesis of the CdSe/CdS interior and formation of the $SiO_x$ buffer layer, but prior to encapsulation of the semiconducting nanoparticles in the silicate matrix. Other data (not shown) indicate that the absolute QY of each of the stabilized quantum dot composites including annealed semiconducting nanoparticles is marginally better than that of the control sample.

Figure 7A:
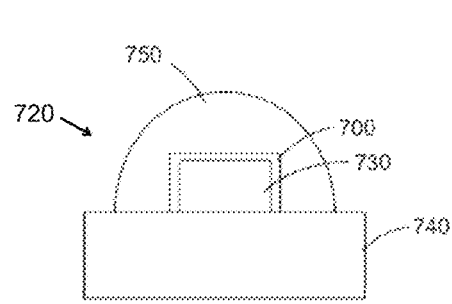
FIG. 7A shows an exemplary light emitting device comprising an LED chip in optical communication with a stabilized quantum dot composite.

Accordingly, the quantum dot composite may be employed in a light emitting device that exhibits improved color stability and/or QY performance compared to luminescent semiconducting nanoparticles that are not embedded in a matrix comprising an ionic metal oxide. Referring to FIG. 7A, the light emitting device 720 may include a blue light emitting diode (LED) chip 730 having a dominant wavelength of 425 nm to 475 nm in optical communication with the stabilized quantum dot composite 700 (which may have any of the characteristics described above or elsewhere in this disclosure) for down conversion of light emitted from the blue LED chip 730. The blue LED chip 730 may be disposed on a submount (substrate) 740 and a lens or encapsulant 750 may overlie the LED chip 730, although other submount or package configurations are possible as described below.

The stabilized quantum dot composite 700 may be employed in any of a number of configurations. For example, a coating on the LED chip may include the stabilized quantum dot composite 700, as illustrated in FIG. 7A. Alternatively, a lens overlying the LED chip or an encapsulant on the LED chip may include the stabilized quantum dot composite. For example, the stabilized quantum dot composite 700 may be coated on an inner or outer surface of the lens, or the composite 700 may be dispersed throughout the volume of the encapsulant. In another example, a substrate disposed remote from the LED chip may include the stabilized quantum dot composite. More than one type of LED chip (blue and/or other colors) as well as additional phosphors and/or luminescent semiconducting nanoparticles 702 may be employed in the light emitting device 720.

The light emitting device may have any of a number of different packaging configurations. As is well known in the art, in order to use an LED chip in a circuit or other like arrangement, it is known to enclose the LED chip in a package to provide environmental and/or mechanical protection, color selection, light focusing and the like. An LED package may also include electrical leads, contacts or traces for electrically connecting the LED package to an external circuit.

Figure 7B:
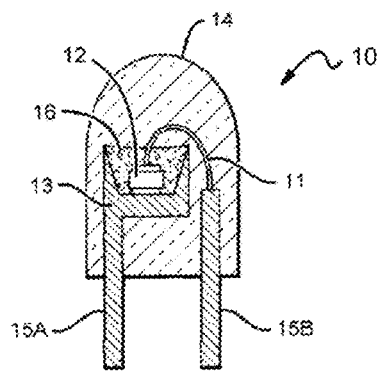
FIGS. 7B-7D show exemplary packaging configurations for a light emitting device including an LED chip and a stabilized quantum dot composite.

A typical LED package 10 is illustrated in FIG. 7B. In this example, a single LED chip 12 is mounted on a reflective cup 13 by means of a solder bond or conductive epoxy. One or more wire bonds 11 connect the contacts of the LED chip 12 to leads 15A and/or 15B, which may be attached to or integral with the reflective cup 13. The reflective cup may be filled with an encapsulant material 16 which may contain a wavelength conversion material such as a phosphor and/or the stabilized quantum dot composite. The entire assembly may be encapsulated in a protective resin 14, which may be molded in the shape of a lens to collimate the light emitted from the LED chip 12.

Figure 7C:
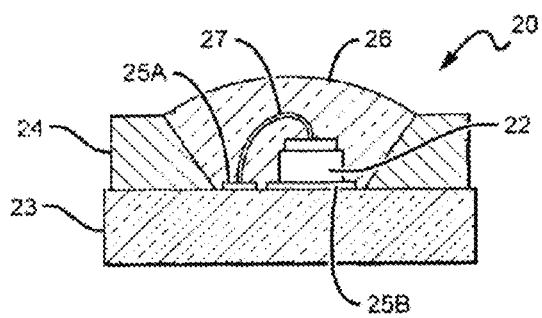

Another conventional LED package 20 is illustrated in FIG. 7C and includes one or more LED chips 22 mounted onto a carrier, such as a printed circuit board (PCB) carrier, as well as leads and a substrate or submount. In this embodiment, a reflector 24 mounted on a submount 23 surrounds the LED chip(s) 22 and reflects light emitted by the LED chip(s) 22 away from the package 20. The reflector 24 also provides mechanical protection to the LED chips 22. One or more wirebond connections 27 may be made between contacts on the LED chips 22 and electrical traces 25A, 25B on the submount 23. The mounted LED chips 22 are then covered with an encapsulant 26, such as a silicone, which may provide environmental and mechanical protection to the chips while also acting as a lens. As described above, the encapsulant may contain wavelength conversion material(s), such as the stabilized quantum dot composite described herein. Other exemplary LEDs comprise LED packages formed of a plastic material that is molded about a lead frame, and the LED chip(s) is mounted in a cavity of the package, and an optically transmissive encapsulant, such as silicone, is dispensed into the cavity over the LED chip(s). Again, wavelength conversion material(s) such as the stabilized quantum dot composite can be dispersed in the encapsulant.

Figure 7D:
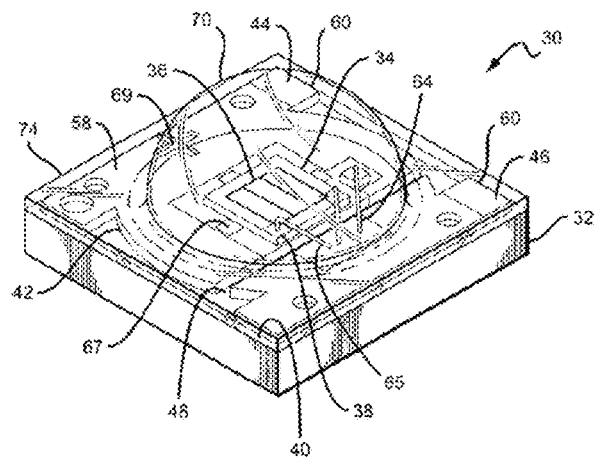

Another exemplary LED package 30 is shown in FIG. 7D and comprises an LED chip 34 on a submount 32 with a molded lens 70, such as a silicone lens, formed over it. The lens 70 can include wavelength conversion material(s), such as the stabilized quantum dot composite described herein, dispersed therein and/or on the LED chip. The LED chip 32 can also be coated by a conversion material that can convert all or most of the light from the LED. The lens can be molded in different shapes, such as hemispherical, planar, chopped or other shapes. An example of such LEDs is described in U.S. Pat. Nos. 9,070,850 and 9,048,396, assigned to the same assignee as the present application and hereby incorporated by reference. It is noted that other reference numbers shown in FIG. 7D are defined in U.S. Pat. No. 9,070,850. Alternative light emitting device designs that include multiple LEDs mounted within a cavity and covered with an encapsulant with wavelength conversion material(s) dispersed therein are described in U.S. Pat. No. 8,624,271, assigned to the same assignee as the present patent application and hereby incorporated by reference.

LED chips generally comprise one or more active layers of semiconductor material sandwiched between oppositely doped layers. When a bias is applied across the doped layers, holes and electrons are injected into the active layer where they recombine to generate light. Light is emitted from the active layer and from various surfaces of the LED. Light is emitted by the LED chip at a primary wavelength. The primary radiation may be absorbed by the wavelength conversion material (e.g., phosphor, stabilized quantum dot composite, etc.), which responsively emits light at secondary wavelength(s). The primary and/or secondary wavelengths of light can mix to produce a desired color of light. As would be understood by one of skill in the art, depending on the primary wavelength(s) and the amount of loading of the wavelength conversion material(s), as well as their light absorption/emission characteristics, various color temperatures of white light can be produced by the LEDs.

The LED chips shown schematically in FIGS. 7A-7D may be group III nitride-based LED chips whose active region is formed from nitrogen and group III elements such as aluminum, gallium and/or indium in the form of nitride layers epitaxially grown and doped, as would be understood by one of ordinary skill in the art, to produce light in the green to UV spectral ranges, for example blue light. As illustrated in the preceding examples, the stabilized quantum dot composite may be incorporated into silicone or another optically transparent encapsulant material and coated onto the LED chip. In other embodiments, the stabilized quantum dot composite can be placed in and/or on an encapsulant and/or optic of the LED chip, such as silicone, epoxy or glass. The stabilized quantum dot composite may emit at the same or different wavelengths depending on the composition and size of the perovskite particles. Also, phosphors, such as red nitride phosphors and/or green or yellow LuAG or YAG phosphors, can be mixed together with the stabilized luminescent particles in the matrix and/or positioned separately (e.g., in a remote phosphor configuration) on the optic and/or in discrete layers on the LED chip. The result may be a light emitting device that emits warm white light (e.g., 2700K to 4000K) and/or comprises a high CRI (e.g., greater than 90) and/or has an increased gamut.

The LED components, packages and light emitting devices described above may be fabricated using methods known in the art, as described for example in U.S. Patent Application Publication No. 2012/0280261, entitled "Light Emitting Diode (LED) for Achieving an Asymmetric Light Output," which is hereby incorporated by reference. In addition, the blue LED chips may be coated with the aforementioned stabilized quantum dot composite or phosphors using any suitable method, such as that described U.S. Patent Application Publication Nos. 2008/0179611 and 2008/0173884, both of which are entitled "Wafer Level Phosphor Coating Method and Devices Fabricated Utilizing Method," and hereby incorporated by reference. As set forth in these patent publications, LED chips can be coated and/or sprayed by phosphors, the stabilized quantum dot composite (e.g., in the form of microparticles), and/or other wavelength conversion materials. The LED chips may also be coated using electrophoretic deposition (EPD), such as with the EPD method described in U.S. Pat. No. 8,563,339 to Tarsa et al., entitled "Closed Loop Electrophoretic Deposition of Semiconductor Devices," which is hereby incorporated by reference.

Figure 8A:
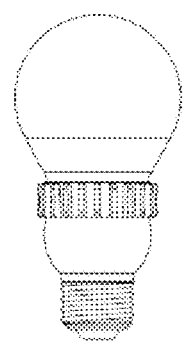
FIGS. 8A-8E show exemplary light fixtures that may utilize the light emitting devices and stabilized quantum dot composite described herein.
Figure 8B:
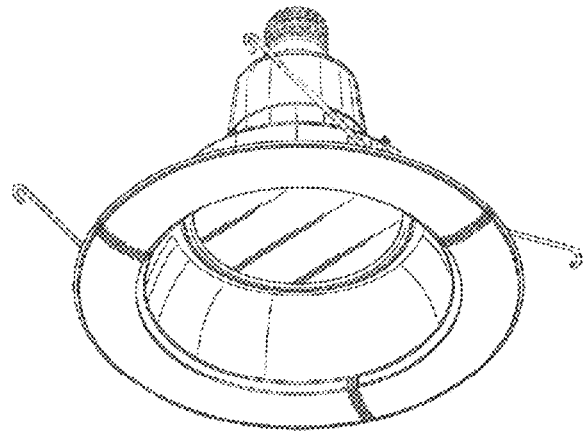
Figure 8C:
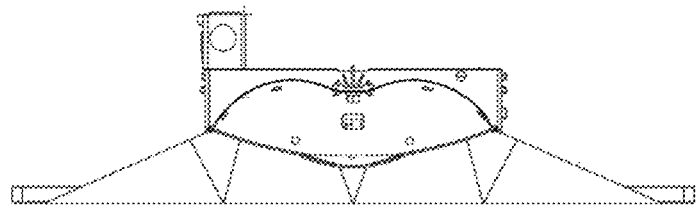
Figure 8D:
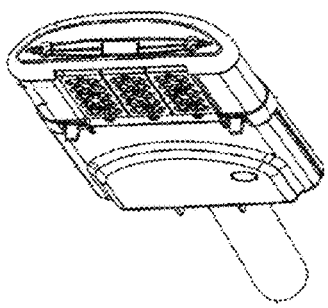
Figure 8E:
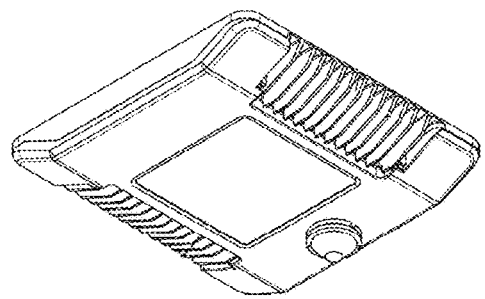

The light emitting devices comprising the stabilized quantum dot composite described herein may have particular utility with respect to various form factor light fixtures. For example, each of the embodiments disclosed herein may be alternatively implemented in various types of solid state light fixtures including, for example, downlights, troffers, street lights, canopy lights, parking garage lights, lights that use waveguide technology and other lighting fixtures. FIG. 8A illustrates an omnidirectional light bulb, such as an A19 bulb. Other similar consumer lights, such as PAR, BR and candelabra bulbs, can also implement the light emitting devices described herein. Exemplary lights are described in U.S. Pat. Nos. 8,591,062 and 8,596,819 and U.S. Patent Publication No. 2015/0362168, each of which is hereby incorporated by reference. FIG. 8B shows another downlight that can incorporate light emitting devices described herein. An example of such a downlight is disclosed in U.S. Pat. No. 8,777,449, which is hereby incorporated by reference. FIG. 8C illustrates a troffer light fixture that can incorporate the light emitting devices described herein. An exemplary troffer light fixture is disclosed in U.S. Published Patent Publication No. US2012/0327650, which is hereby incorporated by reference. In another example, FIG. 8D illustrates a solid state street light that may include the light emitting devices described herein. Other street lights and outdoor lighting fixtures that can be implemented using the light-emitting devices described herein include the lights disclosed in U.S. Pat. Nos. 8,622,584; 8,425,071; 9,028,087; and U.S. Patent Publication No. 2015/0253488, each of which is hereby incorporated by reference. Finally, FIG. 8E illustrates a canopy light which is described in U.S. Pat. No. 9,182,096, which is hereby incorporated by reference. Light emitting devices described herein may also be implemented in various other lighting fixtures, such as, for example, in the waveguide-based troffers disclosed in U.S. Patent Publication No. 2014/0347885, in the troffer style fixtures disclosed in U.S. Patent Publication No. 2012/0051041 and/or in the waveguide-based garage lights disclosed in U.S. Patent Publication No. 2014/0355302, each of which is hereby incorporated by reference. Other and similar light fixtures can be implemented using the above-described circuitry.

As known to those skilled in the art, lamps have been developed utilizing solid state light sources, such as LEDs, in combination with a conversion material that is separated from or remote to the LEDs. Such arrangements are disclosed in U.S. Pat. No. 6,350,041, entitled "High Output Radial Dispersing Lamp Using a Solid State Light Source," which is hereby incorporated by reference. Suitable lamps can comprise a solid state light source that transmits light through a separator to a disperser including one or more phosphors and/or the stabilized quantum dot composite. The disperser can disperse the light in a desired pattern and/or changes its color by converting at least some of the light to a different wavelength through the phosphor(s), stabilized quantum dot composite, and/or other wavelength conversion material. In some embodiments, the separator spaces the light source a sufficient distance from the disperser such that heat from the light source will not transfer to the disperser when the light source is carrying elevated currents necessary for room illumination. Additional remote phosphor techniques are described in U.S. Pat. No. 7,614,759, entitled "Lighting Device," which is hereby incorporated by reference.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein.

Furthermore, the advantages described above are not necessarily the only advantages of the invention, and it is not necessarily expected that all of the described advantages will be achieved with every embodiment of the invention.

The invention claimed is:

1. A stabilized quantum dot composite comprising:
a plurality of luminescent semiconducting nanoparticles embedded in a matrix comprising an ionic metal oxide having a chemical formula $nA_xO_y \cdot mB_zO_w$, wherein A includes one or more elements selected from the group consisting of Li, Na, K, Rb, Cs, Be, Mg, Ca, Sr, wherein B includes one or more elements selected from the group consisting of B, Al, Ga, In, Si, Ge, Sn, and Pb, wherein x, y, z, and w are positive integers, and wherein n and m are stoichiometry coefficients.

2. The stabilized quantum dot composite of claim 1 having a morphology selected from the group consisting of: a microparticle, a coating, and a macroscopic body.

3. The stabilized quantum dot composite of claim 1, wherein x=2, y=1, z=1, and w=2, and the chemical formula is $nA_2O \cdot mBO_2$.

4. The stabilized quantum dot composite of claim 1, wherein A comprises K, wherein B comprises Si, and wherein the ionic metal oxide comprises potassium silicate.

5. The stabilized quantum dot composite of claim 4, wherein the potassium silicate comprises $nK_2O \cdot mSiO_2$ in a molar ratio n:m from about 1:1.5 to about 1:4.5.

6. The stabilized quantum dot composite of claim 1, wherein the luminescent semiconducting nanoparticles comprise a semiconductor selected from the group consisting of: group IV, group II-VI semiconductors, group III-V semiconductors, group $I-III-VI_2$ semiconductors, and perovskite semiconductors.

7. The stabilized quantum dot composite of claim 6, wherein an interior of each of the luminescent semiconducting nanoparticles comprises the semiconductor, and further comprising a buffer layer surrounding the interior.

8. The stabilized quantum dot composite of claim 7, wherein the buffer layer comprises an oxide coating.

9. The stabilized quantum dot composite of claim 1 being optically transparent.

10. A light emitting device comprising:
a blue light emitting diode (LED) chip having a dominant wavelength of 425 nm to 475 nm in optical communication with the stabilized quantum dot composite of claim 1 for down conversion of light emitted from the blue LED chip.

11. The light emitting device of claim 10 disposed in a lighting fixture selected from the group consisting of: omni-directional light bulb, candelabra bulb, downlight, troffer, street light, outdoor light, canopy light, parking garage light, waveguide-based troffer, waveguide-based garage light, and lamp.

12. The light emitting device of claim 10, wherein a coating on the LED chip comprises the stabilized quantum dot composite.

13. The light emitting device of claim 10, wherein an optical lens overlying the LED chip comprises the stabilized quantum dot composite.

14. The light emitting device of claim 10, wherein a polymeric encapsulant on the LED chip comprises the stabilized quantum dot composite.

15. The light emitting device of claim 10, wherein a coated substrate positioned remote from the LED chip comprises the stabilized quantum dot composite.

* * * * *